US012374387B2

(12) United States Patent
Lee

(10) Patent No.: US 12,374,387 B2
(45) Date of Patent: Jul. 29, 2025

(54) MEMORY DEVICE AND OPERATING METHOD OF THE MEMORY DEVICE FOR CONTROLLING A CHANNEL VOLTAGE

(71) Applicant: SK hynix Inc., Icheon-si (KR)

(72) Inventor: Hee Youl Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 226 days.

(21) Appl. No.: 17/986,628

(22) Filed: Nov. 14, 2022

(65) Prior Publication Data

US 2023/0386562 A1 Nov. 30, 2023

(30) Foreign Application Priority Data

May 31, 2022 (KR) .......................... 10-2022-0066434

(51) Int. Cl.
*G11C 11/4096* (2006.01)
*G11C 11/4074* (2006.01)
*G11C 11/4093* (2006.01)
*G11C 11/4094* (2006.01)

(52) U.S. Cl.
CPC ...... *G11C 11/4096* (2013.01); *G11C 11/4074* (2013.01); *G11C 11/4093* (2013.01); *G11C 11/4094* (2013.01)

(58) Field of Classification Search
CPC ............ G11C 11/4096; G11C 11/4074; G11C 11/4093; G11C 11/4094; G11C 16/26; G11C 16/0483; G11C 16/08; G11C 16/30; G11C 7/1048; G11C 16/24; H10B 41/23
See application file for complete search history.

(56) References Cited

U.S. PATENT DOCUMENTS

| | | | | |
|---|---|---|---|---|
| 9,679,660 | B1* | 6/2017 | Bae | G11C 16/08 |
| 2006/0274588 | A1* | 12/2006 | Kang | G11C 16/26 365/203 |
| 2013/0272081 | A1* | 10/2013 | Lee | G11C 16/26 365/203 |
| 2020/0176066 | A1* | 6/2020 | Her | G06F 11/076 |
| 2020/0321042 | A1* | 10/2020 | Lee | G11C 16/26 |
| 2022/0130474 | A1* | 4/2022 | Choi | H01L 25/18 |
| 2022/0319614 | A1* | 10/2022 | Senoo | G11C 16/30 |
| 2023/0109025 | A1* | 4/2023 | Park | G11C 16/0483 365/185.25 |

FOREIGN PATENT DOCUMENTS

| | | |
|---|---|---|
| KR | 101697270 B1 | 1/2017 |
| KR | 1020200118711 A | 10/2020 |

* cited by examiner

Primary Examiner — Jerome Leboeuf
(74) Attorney, Agent, or Firm — WILLIAM PARK & ASSOCIATES LTD.

(57) ABSTRACT

A memory device, and a method of operating the memory device, includes a memory block including strings formed between bit lines and a source line and includes a peripheral circuit configured to perform a read operation of a selected memory cell included in a selected string among the strings. The peripheral circuit includes page buffers configured to increase a voltage of channels of the strings by applying a first precharge voltage to the bit lines in a set-up phase of the read operation, apply a second precharge voltage lower than the first precharge voltage to the bit lines in a read phase of the read operation, and discharge the bit lines in a discharge phase of the read operation.

16 Claims, 14 Drawing Sheets

MEMORY DEVICE AND OPERATING METHOD OF THE MEMORY DEVICE FOR CONTROLLING A CHANNEL VOLTAGE

CROSS-REFERENCE TO RELATED APPLICATION

The present application claims priority under 35 U.S.C. § 119(a) to Korean patent application number 10-2022-0066434, filed on May 31, 2022, in the Korean Intellectual Property Office, the entire disclosure of which is incorporated herein by reference.

BACKGROUND

1. Technical Field

The present disclosure generally relates to a memory device and a manufacturing method of the memory device, and more particularly, to a memory device having a three-dimensional structure and an operating method of the memory device.

2. Related Art

A memory device may include a memory cell array in which data is stored and a peripheral circuit configured to perform program, read, and erase operations.

The memory cell array may include a plurality of memory blocks, and each of the plurality of memory blocks may include a plurality of memory cells.

The peripheral circuit may include a control circuit for controlling overall operations of the memory device in response to a command transmitted from an external controller and circuits configured to perform program, read, and erase operations under the control of the control circuit.

To increase capacity and reduce weight of the memory device, the degree of integration of the memory device must increase. When the degree of integration of the memory device increases, sizes of elements constituting the memory device, e.g., transistors and lines and distances between the elements decrease. When the sizes of the elements and the distances between the elements decrease, electrical influence between adjacent elements increases, and therefore, the reliability of the memory device in program, read, and erase operations may deteriorate.

SUMMARY

Some embodiments provide a memory device and an operating method of the memory device, in which a channel boosting level of strings is increased in a read operation of the memory device, so that the reliability of the read operation can be improved.

In accordance with an embodiment of the present disclosure, a memory device includes a memory block including strings formed between bit lines and a source line and includes a peripheral circuit configured to perform a read operation of a selected memory cell included in a selected string among the strings. The peripheral circuit includes page buffers configured to increase a voltage of channels of the strings by applying a first precharge voltage to the bit lines in a set-up phase of the read operation, apply a second precharge voltage lower than the first precharge voltage to the bit lines in a read phase of the read operation, and discharge the bit lines in a discharge phase of the read operation.

Also in accordance with the present disclosure is a method of operating a memory device. The method includes: increasing a channel voltage by applying a first precharge voltage to bit lines electrically coupled to channels; applying a second precharge voltage lower than the first precharge voltage to the bit lines, when the channel voltage is increased; applying a read voltage to a selected word line among word lines arranged between the bit lines and a source line; and discharging the bit lines and the word lines.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural and functional descriptions disclosed herein are merely illustrative for the purpose of describing embodiments according to the concept of the present disclosure. Additional embodiments according to the concept of the present disclosure can be implemented in various forms. Thus, the present disclosure should not be construed as limited to the embodiments set forth herein.

Hereinafter, it will be understood that, although the terms "first," "second," "third," etc. may be used herein to describe various elements, these elements should not be limited by these terms. These terms are only used to distinguish one element from another element and not to indicate a number or order of elements.

Figure 1:
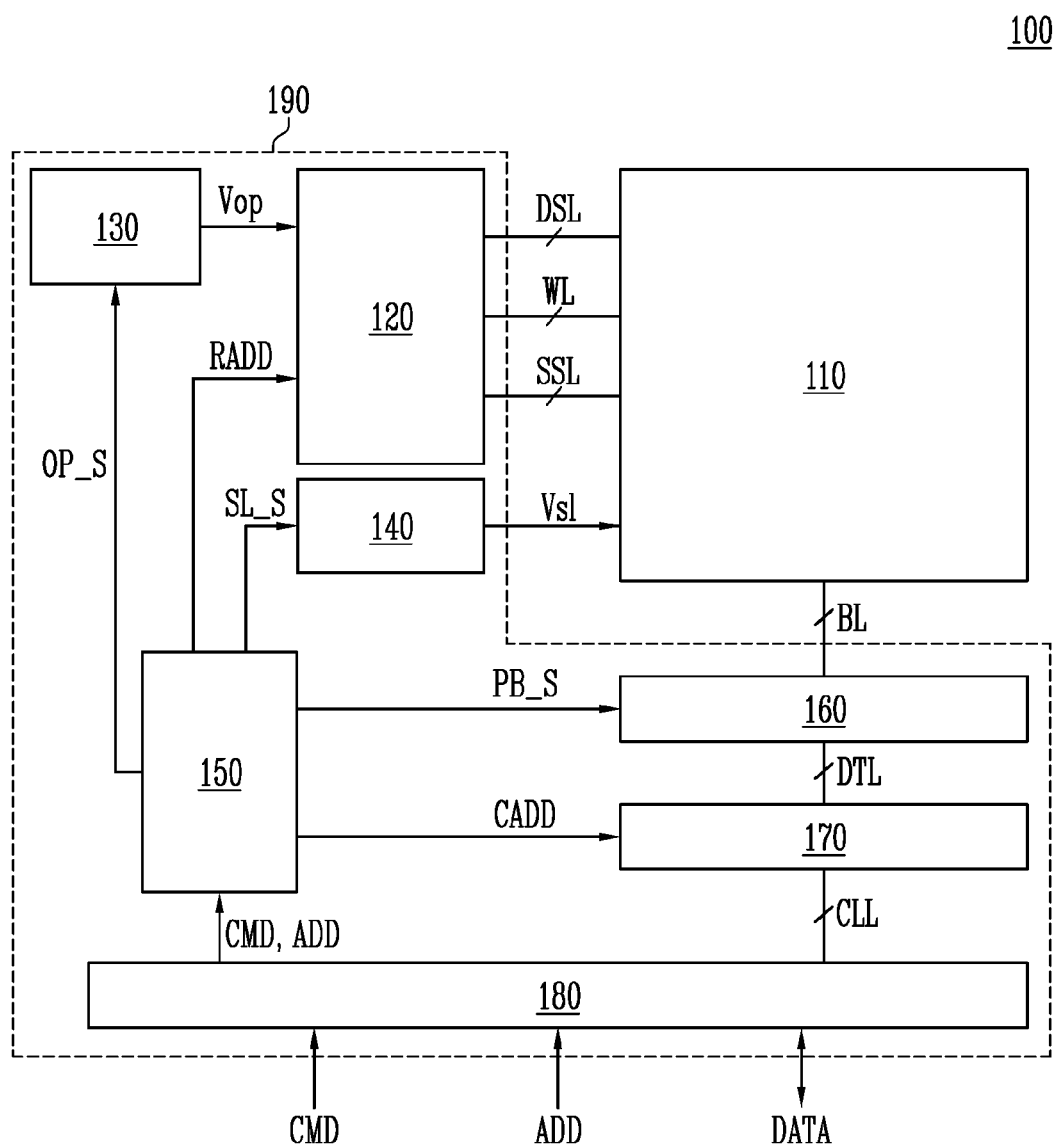
FIG. 1 is a diagram illustrating a memory device in accordance with an embodiment of the present disclosure.

FIG. 1 is a diagram illustrating a memory device in accordance with an embodiment of the present disclosure.

Referring to FIG. 1, the memory device 100 may include a memory cell array 110 and a peripheral circuit 190.

The memory cell array 110 may include a plurality of memory cells in which data is stored. In an embodiment, the memory cell array 110 may include a three-dimensional memory cell array. The plurality of memory cells may store one-bit data or multi-bit data of two or more bits according to a program manner. The plurality of memory cells may constitute a plurality of memory cell strings. For example, each of the memory cell strings may include a plurality of memory cells connected in series through a channel layer. The channel layer may be connected between bit lines BL and a source line.

The peripheral circuit 190 may be configured to perform a program operation for storing data in the memory cell array 110, a read operation for outputting data stored in the memory cell array 110, and an erase operation for erasing data stored in the memory cell array 110. The peripheral circuit 190 may include a row decoder 120, a voltage generating circuit 130, a source line driver 140, a control circuit 150, a page buffer group 160, a column decoder 170, and an input/output circuit 180.

The row decoder 120 may be connected to the memory cell array 110 through a plurality of drain select lines DSL, a plurality of word lines WL, and a plurality of source select lines SSL. The row decoder 120 may transfer operating voltages Vop to the plurality of drain select lines DSL, the plurality of word lines WL, and the plurality of source select lines SSL in response to a row address RADD.

The voltage generating circuit 130 may generate various operating voltages Vop used for a program operation, a read operation, or an erase operation in response to an operation signal OP_S.

The source line driver 140 may transmit a source voltage Vsl supplied therefrom to the source line connected to the memory cell array 110 or float the source line in response to a source line control signal SL_S. The source voltage Vsl may be 0V, a positive voltage higher than 0V, or a negative voltage lower than 0V. The source line driver 140 may float the source line by turning off a transistor for transmitting the source voltage Vsl to the source line.

The control circuit 150 may output the operation signal OP_S, the row address RADD, the source line control signal SL_S, a page buffer control signal PB_S, and a column address CADD, in response to a command CMD and an address ADD.

The page buffer group 160 may include a plurality of page buffers connected to the memory cell array 110 through the bit lines BL. The page buffers may temporarily store data DATA received through a plurality of bit lines BL in response to the page buffer control signal PB_S. The page buffers may sense voltages or currents of the plurality of bit lines BL in a read operation.

The column decoder 170 may transmit data DATA input from the input/output circuit 180 to the page buffer group 160 or transmit data DATA stored in the page buffer group 160 to the input/output circuit 180, in response to the column address CADD. The column decoder 170 may exchange data DATA with the input/output circuit 180 through column lines CLL. The column decoder 170 may exchange data DATA with the page buffer group 160 through data lines DTL.

The input/output circuit 180 may transfer, to the control circuit 150, a command CMD and an address ADD, which are transferred from an external device (e.g., a controller) of the memory device 100. The input/output circuit 180 may receive data transferred from the external device in a program operation, and output data read from selected memory cells to the external device in a read operation.

Figure 2:
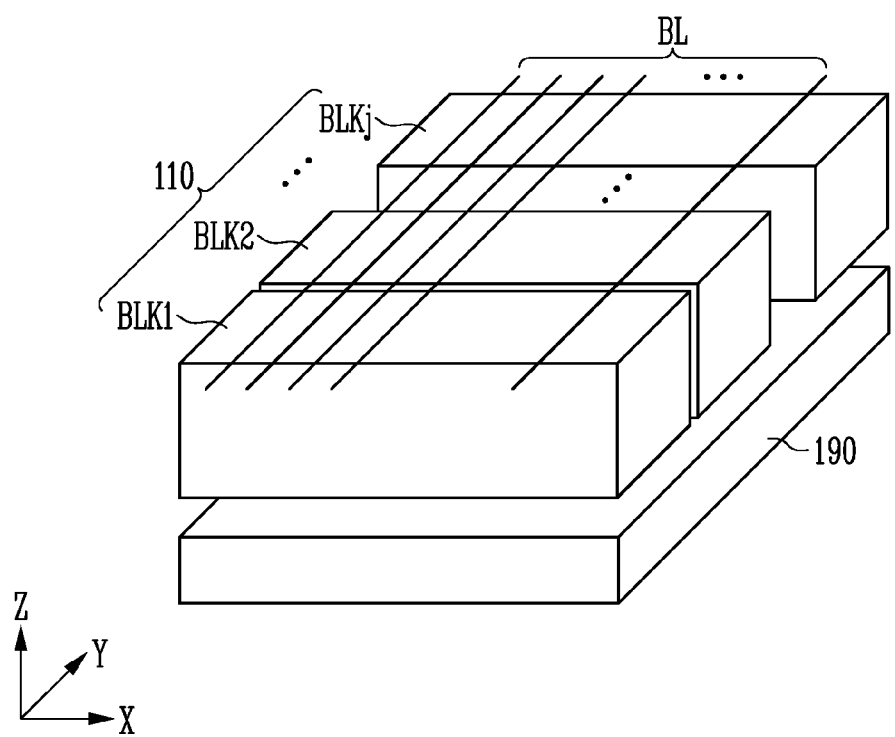
FIG. 2 is a diagram illustrating an arrangement of a memory cell array and a peripheral circuit.

FIG. 2 is a diagram illustrating an arrangement of a memory cell array and a peripheral circuit.

Referring to FIG. 2, the memory device 100 may include a peripheral circuit 190 and a memory cell array 110. The peripheral circuit 190 may be disposed above a substrate, and the memory cell array 110 may disposed above the peripheral circuit 190. The memory cell array 110 may include first to jth memory blocks BLK1 to BLKj. A plurality of bit lines BL may be disposed above the first to jth memory blocks BLK1 to BLKj.

The plurality of bit lines BL may be spaced apart from each other in an X direction, and extend along a Y direction. The first to jth memory blocks BLK1 to BLKj may be spaced apart from each other in the Y direction. The first to jth memory blocks BLK1 to BLKj may be configured identically to one another, and therefore, the first memory block BLK1 will be described in detail below as an example.

Figure 3:
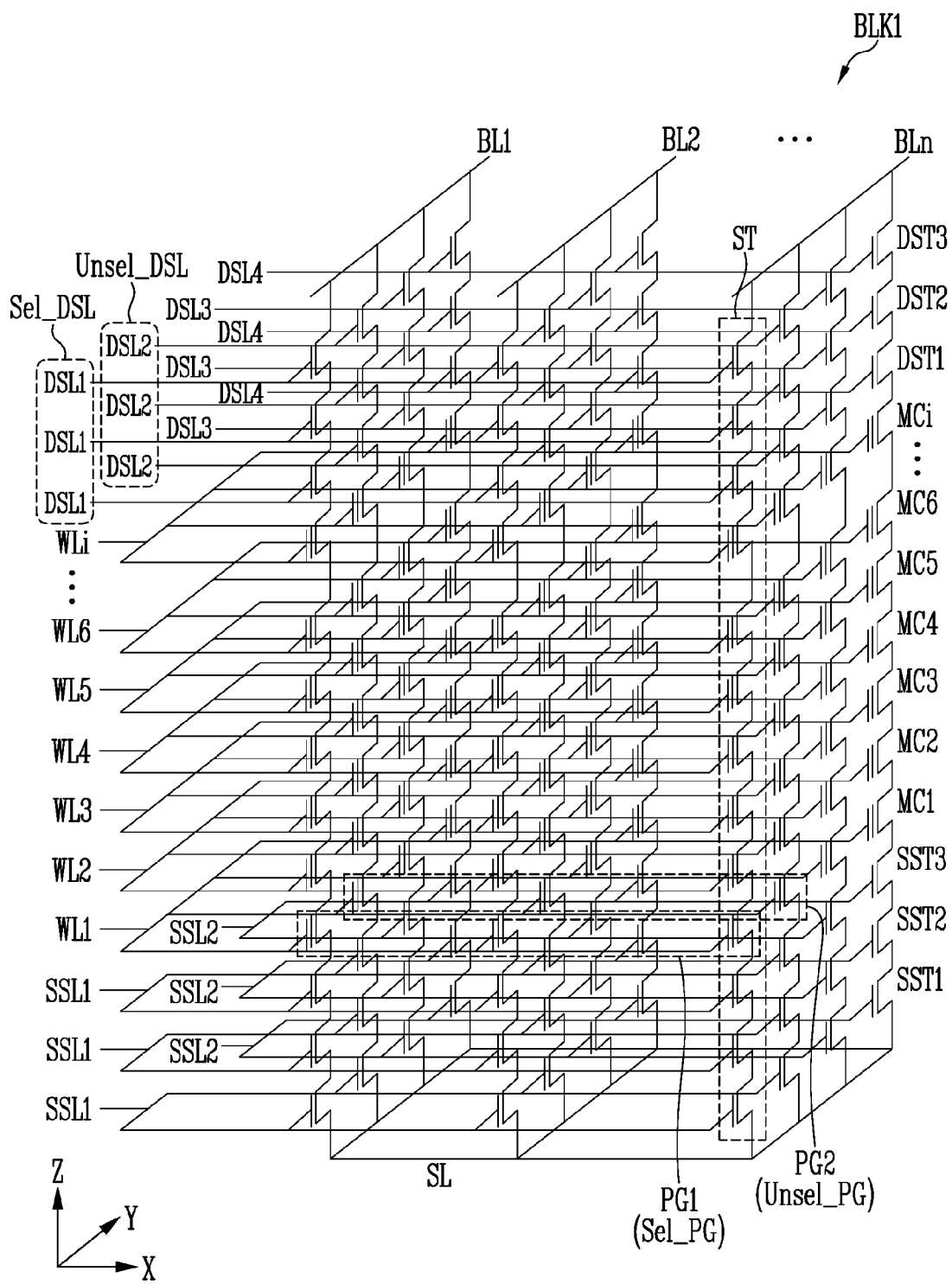
FIG. 3 is a diagram illustrating a memory block.

FIG. 3 is a diagram illustrating a memory block.

Referring to FIG. 3, the first memory block BLK1 includes strings ST connected between first to nth bit lines BL1 to BLn and a source line SL. The first to nth bit lines BL1 to BLn extend along the Y direction, and are arranged to be spaced apart from each other along the X direction. Therefore, the strings ST may also be arranged to be spaced apart from each other along the X and Y directions. For example, strings ST may be arranged between the first bit line BL1 and the source line SL, and strings ST may be arranged between the second bit line BL2 and the source line SL. In this manner, strings ST may be arranged between the nth bit line BLn and the source line SL. The strings ST may extend along a Z direction.

Any one string ST among the strings ST connected to the nth bit line BLn will be described as an example. The string ST may include first to third source select transistors SST1 to SST3, first to ith memory cells MC1 to MCi, and first to third drain select transistors DST1 to DST3. The first memory block BLK1 shown in FIG. 3 represents a diagram illustrating a structure of a memory block, and therefore, numbers of source select transistors, memory cells, and drain select transistors, which are included in the strings ST, may be changed according to a memory device.

Gates of first to third source select transistors SST1 to SST3 included in different strings may be connected to first and second source select lines SSL1 and SSL2, gates of first to ith memory cells MC1 to MCi included in different strings may be connected to first to ith word lines WL1 to WLi, and gates of first to third drain select transistors DST1 to DST3 included in different strings may be connected to first to fourth drain select lines DSL1 to DSL4.

The lines connected to the first memory block BLK1 will be described in more detail. First to third source select transistors SST1 to SST3 arranged along the X and Z directions may be connected to the same source select line, and first to third source select transistors SST1 to SST3 arranged along the Y direction may be connected to source select lines isolated from each other. For example, some of first source select transistors SST1 arranged in the Y direction may be connected to a first source select line SSL1, and the other may be connected to a second source select line SSL2. The second source select line SSL2 is a line isolated from the first source select line SSL1. Therefore, a voltage applied to the first source select line SSL1 may be different from a voltage applied to the second source select line SSL2. In this manner, some of second and third source select transistors SST2 and SST3 may be connected to a first source select line SSL1, and the other may be connected to a second source select line SSL2.

Memory cells formed in the same layer among the first to ith memory cells MC1 to MCi may be connected to the same word line. For example, first memory cells MC1 included in different strings ST may be commonly connected to the first word line WL1, and ith memory cells MCi included in different strings ST may be commonly connected to the ith word line WLi. A group of memory cells which are included in different strings ST and are connected to the same word line becomes a page PG. For example, first memory cells in strings ST connected to the first drain select line DSL1 may become a first page PG1, and first memory cells MC1 in strings ST connected to the second drain select line DSL2 may become a second page PG2.

First to third drain select transistors DST1 to DST3 included in different strings ST may be connected to drain select lines isolated from each other. Specifically, first to third drain select transistors DST1 to DST3 arranged along the X direction may be connected to the same drain select line, and first to third drain select transistors DST1 to DST3 arranged along the Y direction may be connected to drain select lines isolated from each other. For example, some of the first drain select transistors DST1 may be connected to a first drain select line DSL1, and the other may be connected to a second drain select line DSL2. The second drain select line DSL2 is a line isolated from the first drain select line DSL1. Therefore, a voltage applied to the first drain select line DSL1 may be different from a voltage applied to the second drain select line DSL2. In this manner, some of the second drain select transistors DST2 may be connected to a first drain select line DSL1, and the other may be connected to a second drain select line. Some of the third drain select transistors DST3 may be connected to a first drain select line DSL1, and the other may be connected to a second drain select line DSL2.

In a program or read operation, selected strings ST may be determined by a selected drain select line Sel_DSL among the first to third drain select lines DSL1 to DSL3. Different pages may be determined by a voltage applied to drain select lines. For example, when a first drain select line DSL1 is specified as a selected drain select line Sel_DSL and a second drain select line DSL2 is specified as an unselected drain select line Unsel_DSL, the first page PG1 may become a selected page Sel_PG, and the second page PG2 may become an unselected page Unsel_PG. Strings ST connected to the selected page Sel_PG may become selected strings. The selected page means a page selected as a program target in the program operation, and the unselected page may mean a page which is not programmed in the program operation of the selected page.

Figure 4:
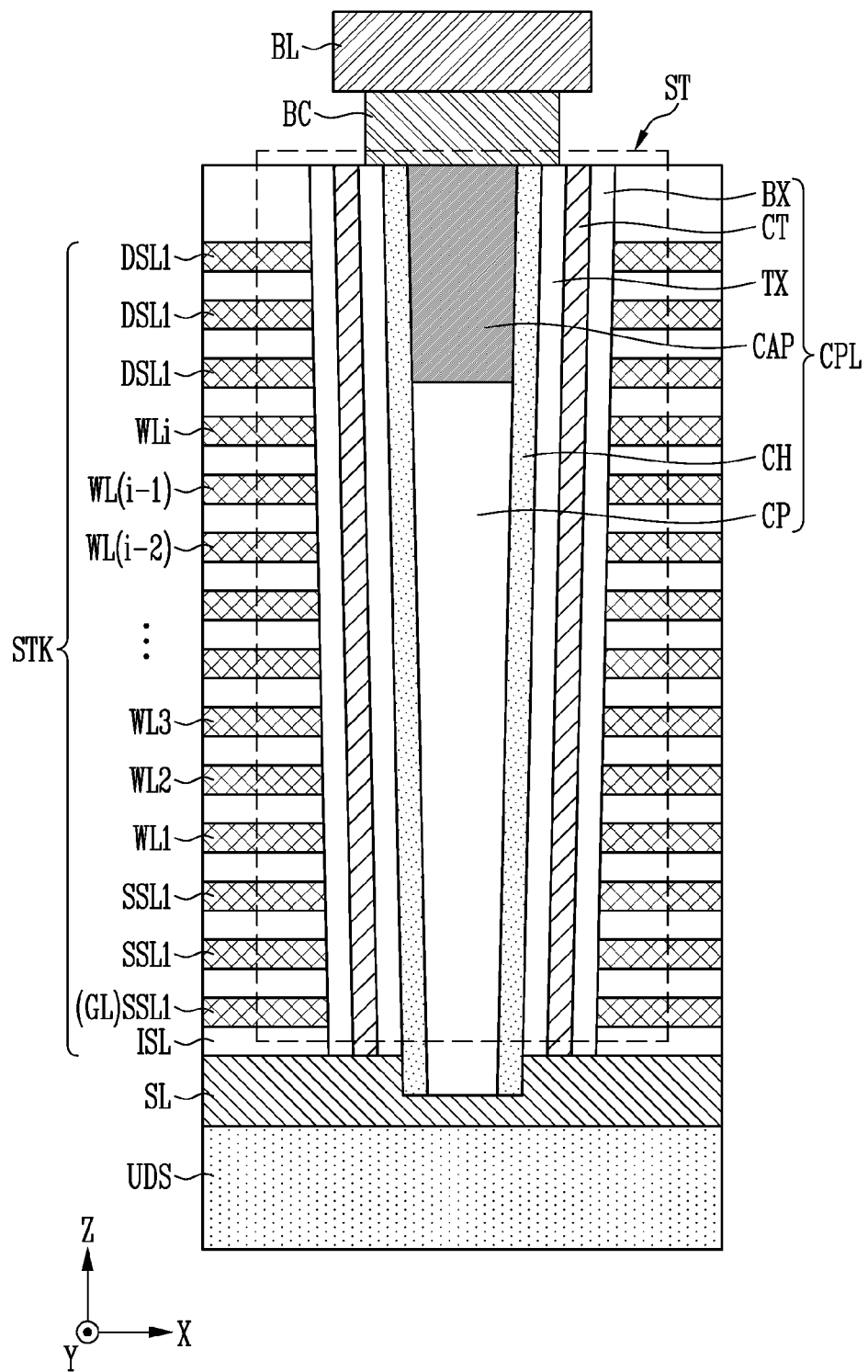
FIG. 4 is a view illustrating a structure of a string included in a memory device.

FIG. 4 is a view illustrating a structure of a string included in a memory device.

Referring to FIG. 4, a source line SL may be formed on a lower structure UDS, and a stack structure STK may be formed on the source line SL. The lower structure UDS may be a substrate or a peripheral circuit. The source line SL may be formed of a conductive material. For example, the source line SL may be formed of poly-silicon. The stack structure STK may include gate lines GL and insulating layers ISL formed between the gate lines GL. The gate lines GL may include first source lines SSL1, first to ith word lines WL1 to WLi, and first drain select lines DSL1. The gate lines GL may be formed of a conductive material. For example, the gate lines GL may be formed of a conductive material such as tungsten (W), molybdenum (Mo), cobalt (Co) or nickel (Ni), or may be formed of a semiconductor material such as silicon (Si) or poly-silicon (Poly-Si). In addition, the gate lines GL may be formed of various metal materials. The insulating layers ISL may be formed of an oxide layer or a silicon oxide layer. For example, some of lines adjacent to the source line SL among the gate lines GL may become the first source select lines SSL1, some of gate lines GL stacked above the first source select lines SSL1 may become the first to ith word lines WL1 to WLi, and gate lines GL formed above the ith word line WLi may become the first drain select lines DSL1.

A string ST may be configured with a cell plug CPL penetrating the stack structure STK. The cell plug CPL may include a blocking layer BX, a charge trap layer CT, a tunnel insulating layer TX, a channel layer CH, a core pillar CP, and a capping layer CAP. For example, the blocking layer BX may be formed in a cylindrical shape penetrating the stack structure STK, and be formed of an oxide layer or a silicon oxide layer. The charge trap layer CT may be formed in a cylindrical shape along an inner wall of the blocking layer BX, and be formed of a nitride layer. The tunnel insulating layer TX may be formed in a cylindrical shape along an inner wall of the charge trap layer CT, and be formed of an oxide layer or a silicon oxide layer. The channel layer CH may be formed in a cylindrical shape along an inner wall of the tunnel insulating layer TX, and be formed of poly-silicon. The core pillar CP may be formed in a cylindrical shape filling the inside of the channel layer CH, and be formed of an insulating material such as an oxide layer or a silicon oxide layer. The capping layer CAP may be formed on the top of the core pillar CP, and be formed of a conductive material. For example, when the capping layer CAP is formed on the top of the core pillar CP, a height of a top surface of the core pillar CP may be formed lower than a height of a top surface of the channel layer CH, and the capping layer CAP may be formed in an upper region of the core pillar CP surrounded by the channel layer CH.

A bit line contact BC and a bit line BL may be formed on the top of the cell plug CPL. For example, the bit line contact BC may be formed of a conductive material, and be in contact with the channel layer CH included in the cell plug CPL. The bit line BL may be formed on the top of the bit line contact BC, and be formed of a conductive material.

An operating method of the above-described memory device will be described as follows.

Figure 5A:
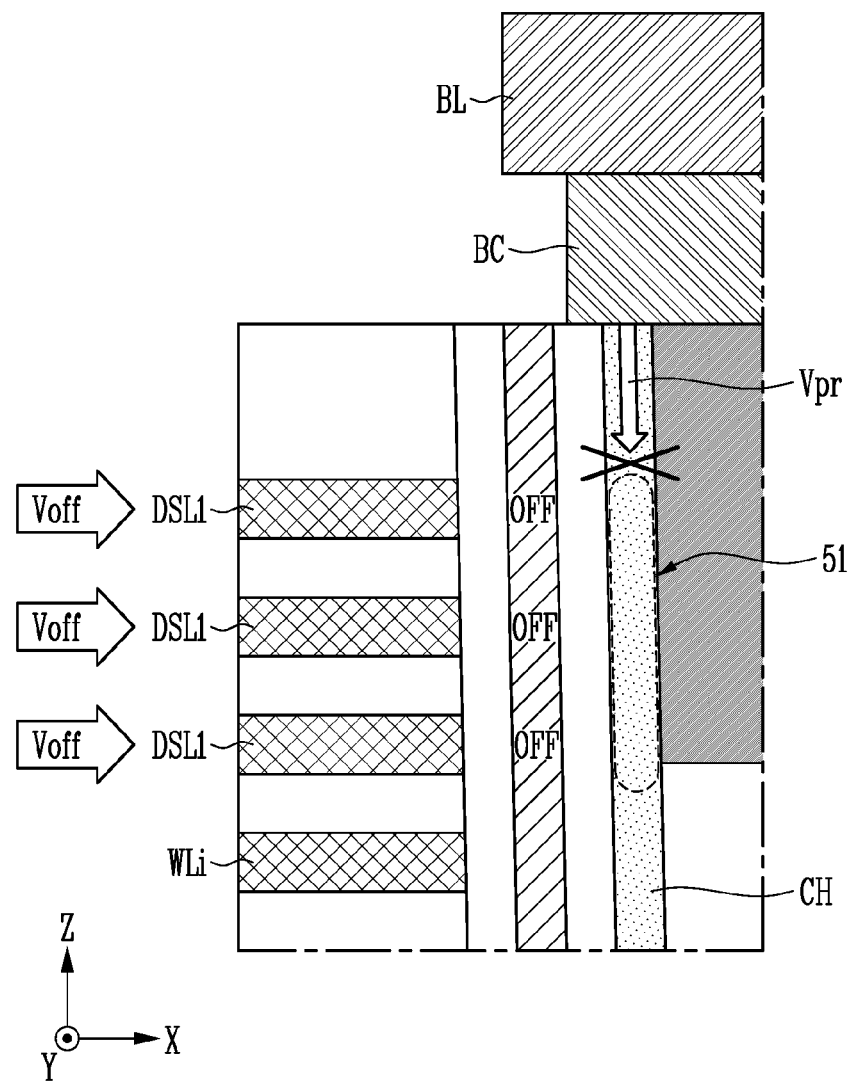
FIGS. 5A and 5B are views illustrating a turn-on or turn-off operation of drain select transistors shown in FIG. 4.
Figure 5B:
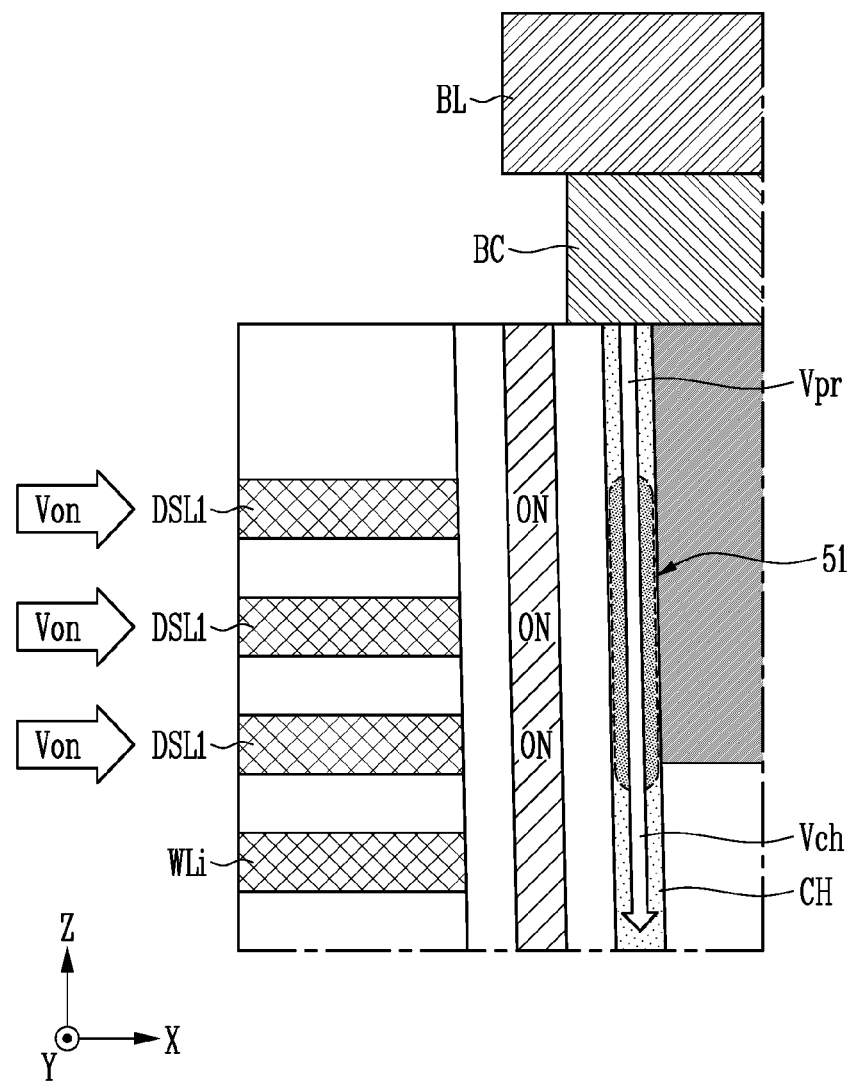

FIGS. 5A and 5B are views illustrating a turn-on or turn-off operation of drain select transistors shown in FIG. 4.

Referring to FIG. 5A, when a turn-off voltage Voff is applied to the first drain select line DSL1, the drain select transistors may be turned off (OFF), no channel is formed in a channel layer CH of the drain select transistors. When no channel is formed in the channel layer CH, a current path 51 through which current can flow is not formed in the channel layer CH of the drain select transistors. Therefore, the bit line BL and a channel layer CH of memory cells may be electrically interrupted. The electrical interruption is indicated with an "X" in FIG. 5A. Accordingly, a precharge voltage Vpr applied to the bit line BL is applied to a channel layer CH formed on the top of the drain select transistors, and is not transmitted to the channel layer CH of the memory cells.

Referring to FIG. 5B, when a turn-on voltage Von is applied to the first drain select lines DSL1, the drain select transistors are turned on (ON), and a channel may be formed in the channel layer CH of the drain select transistors. When the channel is formed in the channel layer CH, the current path 51 through which current can flow may be formed in the channel layer CH of the drain select transistors. Therefore, the bit line BL and the channel layer CH of the memory cells may be electrically connected to each other through the channel layer CH of the drain select transistors. When the precharge voltage Vpr applied to the bit line BL is transmitted to the channel layer CH of the memory cells through the channel layer CH of the drain select transistors, the channel layer CH of the memory cells may be precharged to a channel voltage Vch as a positive voltage by the precharge voltage Vpr.

Figure 6A:
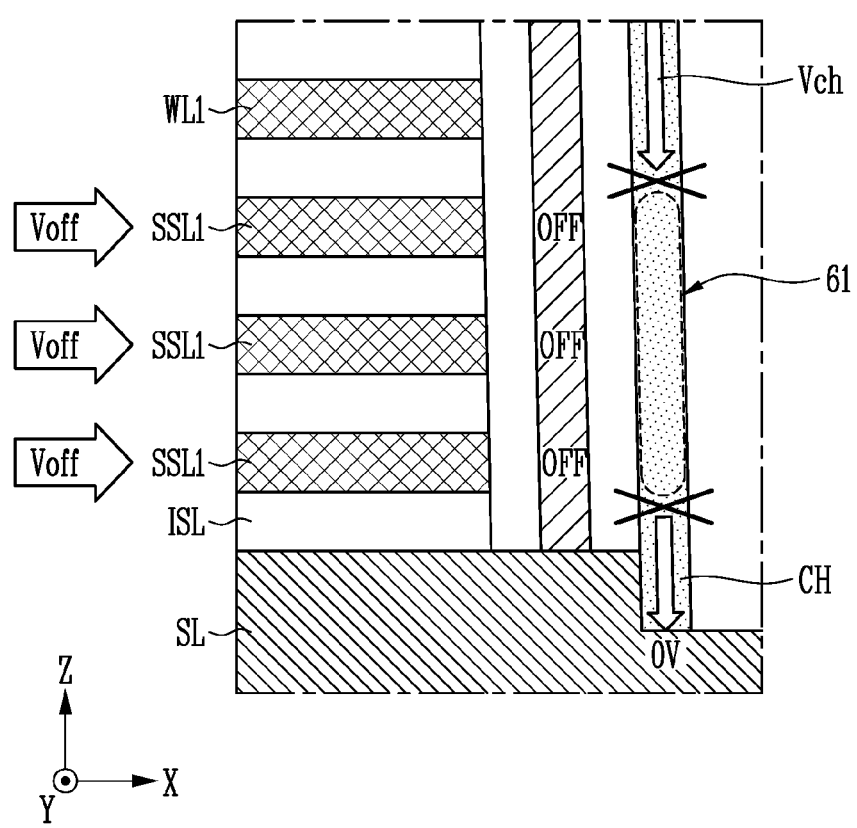
FIGS. 6A and 6B are views illustrating a turn-on or turn-off operation of source select transistors shown in FIG. 4.
Figure 6B:
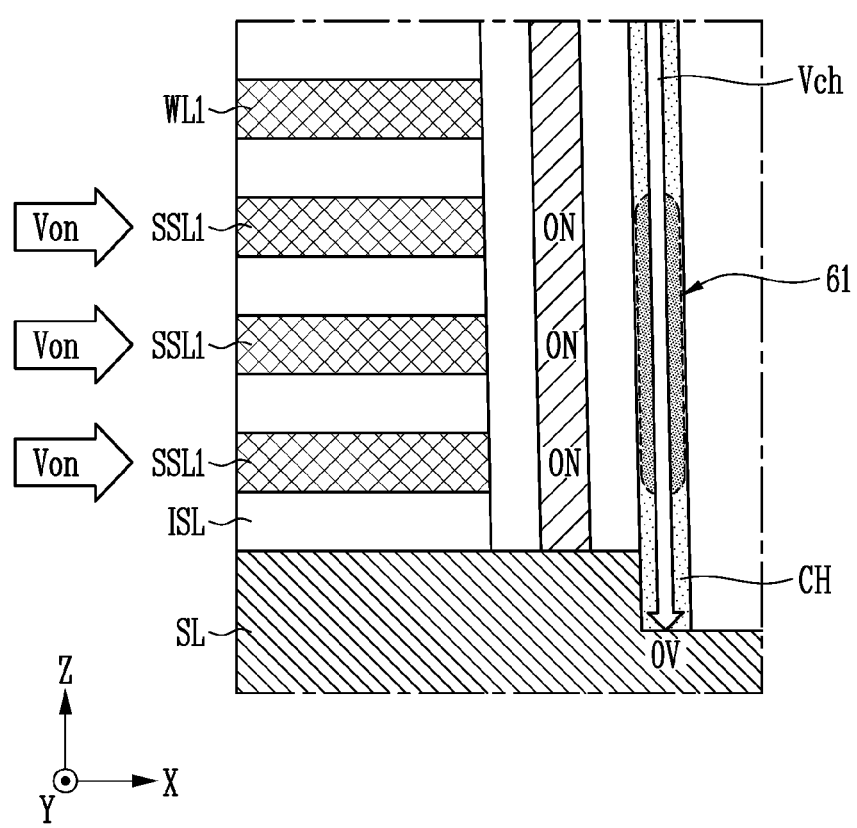

FIGS. 6A and 6B are views illustrating a turn-on or turn-off operation of source select transistors shown in FIG. 4.

Referring to FIG. 6A, when the turn-off voltage Voff is applied to the first source select lines SSL, the source select transistors are turned off (OFF), and no channel is formed in the channel CH of the source select transistors. When no channel is formed in the channel layer CH, a current path 61 through which current can flow is not formed in the channel CH of the source select transistors. Therefore, the source line SL and the channel layer CH of the memory cells may be electrically interrupted. The electrical interruption is indicated with an "X" in FIG. 6A. Accordingly, the channel voltage Vch of the channel layer CH of the memory cells may be applied to the channel layer CH formed on the top of the source select transistors, and a voltage applied to the source line SL may be applied to the channel layer CH formed on the bottom of the source select transistors. Thus, when the source select transistors are turned off (OFF), the level of the channel voltage Vch applied to the channel layer CH of the memory cells is not lowered even though a source line voltage of 0V is applied to the source line SL.

Referring to FIG. 6B, when the turn-on voltage Von is applied to the first source select lines SSL1, the source select transistors are turned on (ON), a channel may be formed in the channel layer CH of the source select transistors. When the channel is formed in the channel layer CH of the source select transistors, the current path 61 through which current can flow may be formed in the channel layer CH of the source select transistors. Therefore, the source line SL and the channel layer CH of the memory cells may be electrically connected to each other through the channel layer CH of the source select transistors. Thus, when the source line voltage of 0V is applied to the source line SL, and the source select transistors are turned on (ON), the channel voltage Vch applied to the channel layer CH of the memory cells is lowered.

Figure 7:
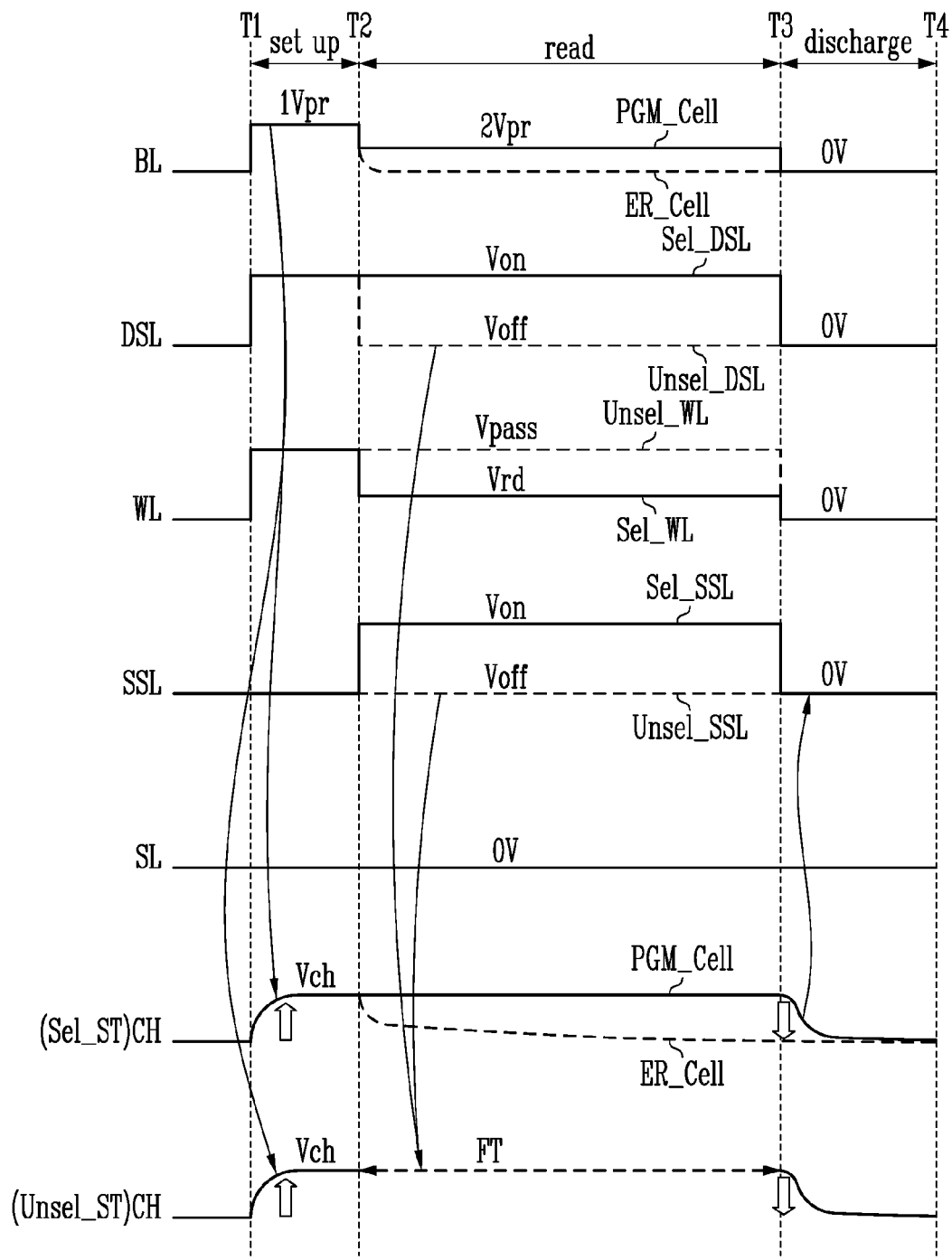
FIG. 7 is a diagram illustrating an operating method of the memory device in accordance with a first embodiment of the present disclosure.

FIG. 7 is a diagram illustrating an operating method of the memory device in accordance with a first embodiment of the present disclosure.

Referring to FIG. 7, a read operation of the memory device may include a set-up phase, a read phase, and a discharge phase.

The set-up phase T1 to T2 is a phase for increasing a potential of the channel layer CH. While the read operation is performed, a ground voltage or a voltage of 0V may be applied to the source line SL. While the set-up phase T1 to T2 is performed, a turn-off voltage Voff may be applied to a selected source select line Sel_SSL and an unselected source select line Unsel-SSL, and a turn-on voltage Von may be applied to a selected drain select line Sel_DSL and an unselected drain select line Unsel_DSL. The turn-off voltage Voff is a voltage at which transistors are turned off, and may be set as 0V. The turn-on voltage Von is a voltage at which the transistors are turned on, and may be set as a positive voltage higher than 0V. A pass voltage Vpass may be applied to unselected word lines Unsel_WL and a selected word line Sel_WL. The pass voltage Vpass is a voltage for turning on unselected memory cells, and may be set as a positive voltage higher than 0V.

In the set-up phase T1 to T2, a first precharge voltage 1Vpr may be supplied to bit lines BL. The first precharge voltage 1Vpr may be set as a positive voltage higher than a second precharge voltage 2Vpr used in the read phase T2 to T3. In the set-up phase T1 to T2, the drain select transistors are turned on by the turn-on voltage Von, and hence the bit lines BL and the channel layer CH may be electrically connected to each other. Therefore, a voltage of the channel layer CH may be increased to a channel voltage as a positive voltage by the first precharge voltage 1Vpr supplied to the bit lines BL. When a high voltage such as the first precharge voltage 1Vpr is applied to the bit line BL in the set-up phase T1 to T2, a voltage of the channel layer CH of selected strings Sel_ST and unselected strings Unsel_ST may be further increased than when the bit lines BL are precharged by the second precharge voltage 2Vpr.

The read phase T2 to T3 is a phase in which a threshold voltage of a selected memory cell is reflected to the bit lines BL. At a second time T2 at which the read phase T2 to T3 is started, the second precharge voltage 2Vpr lower than the first precharge voltage 1Vpr may be applied to the bit lines BL, and the turn-off voltage Voff may be applied to the unselected drain select line Unsel_DSL and the unselected source select line Unsel_SSL. A read voltage Vrd may be applied to the selected word line Sel_WL. When the turn-off voltage Voff is applied to the unselected drain select line Unsel_DSL and the unselected source select line Unsel_SSL, drain select transistors and source select transistors, which are included in the unselected strings Unsel_ST, are turned off, and therefore, the channel layer CH of the unselected strings Unsel_ST may be floated (FT).

The read voltage Vrd is a voltage for determining data of memory cells, and may be set to voltages having various levels according to a threshold voltage distribution of memory cells which become targets of the read operation. While the read voltage Vrd is applied to the selected word line Sel_WL, the pass voltage Vpass is applied.

When the turn-on voltage Von is applied to the selected drain select line Sel_DSL and the selected source select line Sel_SSL, drain and source select transistors included in selected strings are turned on, and therefore, a channel voltage Vch of the selected strings may be maintained or lowered according to a threshold voltage of selected memory cells connected to the selected word line Sel_WL. For example, when the threshold voltage of the selected memory cells is higher than or equal to the read voltage Vrd, the selected memory cells may be determined as program cells PGM_Cell. When the threshold voltage of the selected memory cells is lower than the read voltage Vrd, the selected memory cells may be determined as erase cells ER_Cell. That is, since the threshold voltage of the program cells PGM_Cell is higher than or equal to the read voltage Vrd, the program cells PGM_Cell are turned off, and therefore, the channel voltage Vch of the channel layer CH of the selected strings Sel_ST may be maintained as a voltage precharged in the set-up phase T1 to T2. Alternatively, since the threshold voltage of the erase cells ER_Cell is lower than the read voltage Vrd, the erase cells ER_Cell are turned on, and therefore, the channel voltage Vch of the channel layer CH of the selected strings Sel_ST may become lower than the voltage precharged in the set-up phase T1 to T2.

The discharge phase T3 to T4 is a phase in which voltages of lines connected to a selected memory block and the channel layer CH are reset. For example, in the discharge phase T3 to T4, all lines connected to the selected memory block may be discharged. The term "discharge" means that lines to which a positive voltage is applied are electrically connected to a ground terminal, thereby lowering a voltage of the lines to 0V. In the discharge phase T3 to T4, voltages of the channel layers CH of the selected strings Sel_ST and the unselected string Unsel_ST may be lowered due to coupling to word lines WL. When the voltage of the channel layers CH is low, the voltage of the channel layers CH may be lowered to a level lower than 0V when the word lines WL are discharged. However, in this embodiment, the voltage of the channel layers CH is precharged to a high level by the first precharge voltage 1Vpr in the set-up phase T1 to T2. Hence, the voltage of the channel layers CH is not lowered to a level lower than 0V in the discharge phase T3 to T4.

In the discharge phase T3 to T4, there is no period in which the voltage of the channel layers CH is again increased to 0V from a negative voltage, and hence a phenomenon does not occur, in which the voltages of the word lines are further increased than 0V due to the voltage of the channel layers CH. Accordingly, the reliability of the read operation can be improved.

Figure 8:
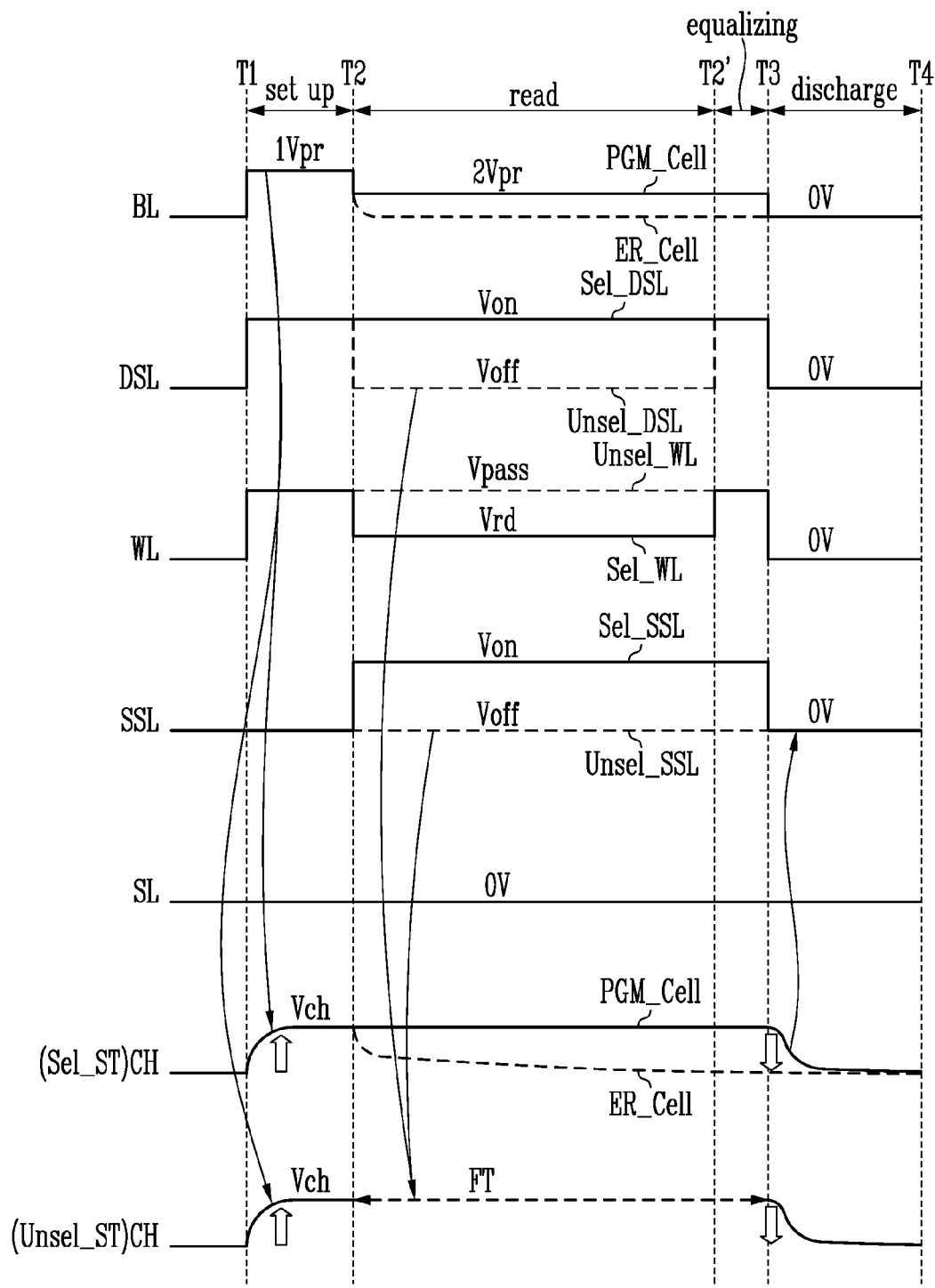
FIG. 8 is a diagram illustrating an operating method of the memory device in accordance with a second embodiment of the present disclosure.

FIG. 8 is a diagram illustrating an operating method of the memory device in accordance with a second embodiment of the present disclosure.

Referring to FIG. 8, a read operation of the memory device may include a set-up phase, a read phase, an equalizing phase, and a discharge phase. In the second embodiment, the equalizing phase T2' to T3 for equally adjusting voltages of word lines WL may be further preformed before the discharge phase T3 to T4 is performed. Each phase will be described in detail as follows.

The set-up phase T1 to T2 is a phase for increasing a potential of the channel layer CH. While the set-up phase T1 to T2 is performed, a turn-off voltage Voff may be applied to a selected source select line Sel_SSL and an unselected source select line Unsel-SSL, and a turn-on voltage Von may be applied to a selected drain select line Sel_DSL and an unselected drain select line Unsel_DSL. The turn-off voltage Voff is a voltage at which transistors are turned off, and may be set as 0V. The turn-on voltage Von is a voltage at which the transistors are turned on, and may be set as a positive voltage higher than 0V. A pass voltage Vpass may be applied to unselected word lines Unsel_WL and a selected word line Sel_WL. The pass voltage Vpass is a voltage for turning on unselected memory cells, and may be set as a positive voltage higher than 0V.

In the set-up phase T1 to T2, a first precharge voltage 1Vpr may be supplied to bit lines BL. The first precharge voltage 1Vpr may be set as a positive voltage higher than a second precharge voltage 2Vpr used in the read phase T2 to T2'. In the set-up phase T1 to T2, the drain select transistors are turned on by the turn-on voltage Von, and hence the bit lines BL and the channel layer CH may be electrically connected to each other. Therefore, a voltage of the channel layer CH may be increased to a channel voltage as a positive voltage by the first precharge voltage 1Vpr supplied to the bit lines BL. When a high voltage such as the first precharge voltage 1Vpr is applied to the bit line BL in the set-up phase T1 to T2, a voltage of the channel layer CH of selected strings Sel_ST and unselected strings Unsel_ST may be further increased than when the bit lines BL are precharged by the second precharge voltage 2Vpr.

The read phase T2 to T2' is a phase in which a threshold voltage of a selected memory cell is reflected to the bit lines BL. At a second time T2 at which the read phase T2 to T2' is started, the second precharge voltage 2Vpr lower than the first precharge voltage 1Vpr may be applied to the bit lines BL, and the turn-off voltage Voff may be applied to the unselected drain select line Unsel_DSL and the unselected source select line Unsel_SSL. A read voltage Vrd may be applied to the selected word line Sel_WL. When the turn-off voltage Voff is applied to the unselected drain select line Unsel_DSL and the unselected source select line Unsel_SSL, drain select transistors and source select transistors, which are included in the unselected strings Unsel_ST, are turned off, and therefore, the channel layer CH of the unselected strings Unsel_ST may be in a floating state (FT).

The read voltage Vrd is a voltage for determining data of memory cells, and may be set to voltages having various levels according to a threshold voltage distribution of memory cells which become targets of the read operation. While the read voltage Vrd is applied to the selected word line Sel_WL, the pass voltage Vpass is applied.

When the turn-on voltage Von is applied to the selected drain select line Sel_DSL and the selected source select line Sel_SSL, drain and source select transistors included in selected strings are turned on, and therefore, a channel voltage Vch of the selected strings may be maintained or lowered according to a threshold voltage of selected memory cells connected to the selected word line Sel_WL. For example, when the threshold voltage of the selected memory cells is higher than or equal to the read voltage Vrd, the selected memory cells may be determined as program cells PGM_Cell. When the threshold voltage of the selected memory cells is lower than the read voltage Vrd, the selected memory cells may be determined as erase cells ER_Cell. That is, since the threshold voltage of the program cells PGM_Cell is higher than or equal to the read voltage Vrd, the program cells PGM_Cell are turned off, and therefore, the channel voltage Vch of the channel layer CH of the selected strings Sel_ST may be maintained as a voltage precharged in the set-up phase T1 to T2. Alternatively, since the threshold voltage of the erase cells ER_Cell is lower than the read voltage Vrd, the erase cells ER_Cell are turned on, and therefore, the channel voltage Vch of the channel layer CH of the selected strings Sel_ST may become lower than the voltage precharged in the set-up phase T1 to T2.

The equalizing phase T2' to T3 is a phase for equally adjusting voltages of word lines WL before the discharge phase T3 to T4, and may be performed to prevent the voltages of the word lines WL from becoming different from each other in the discharge phase T3 to T4 or to prevent voltages of some of the word lines WL from being lowered to a negative voltage. For example, when the equalizing phase T2' to T3 is started, a positive voltage may be applied to the selected word line Sel_WL such that a voltage of the selected word line Sel_WL becomes equal to a voltage applied to the unselected word lines Unsel_WL. The pass voltage Vpass may be applied to the selected word line Sel_WL and the unselected word lines Unsel_WL. The turn-on voltage Von equal to the voltage applied to the selected drain select line Sel_DSL may be applied to the unselected drain select line Unsel_DSL.

The discharge phase T3 to T4 is a phase in which voltages of lines connected to a selected memory block and the channel layer CH are reset. For example, in the discharge phase T3 to T4, all lines connected to the selected memory block may be discharged. The term "discharge" means that lines to which a positive voltage is applied are electrically connected to a ground terminal, thereby lowering a voltage of the lines to 0V. In the discharge phase T3 to T4, a voltage of the channel layers CH of the selected strings Sel_ST and the unselected string Unsel_ST may be lowered due to coupling to word lines WL. When the voltage of the channel layers CH is low, the voltage of the channel layers CH may be lowered to a level lower than 0V when the word lines WL are discharged. However, in this embodiment, the voltage of the channel layers CH is precharged to a high level by the first precharge voltage 1Vpr in the set-up phase T1 to T2. Hence, the voltage of the channel layers CH is not lowered to a level lower than 0V in the discharge phase T3 to T4.

In the discharge phase T3 to T4, there is no period in which the voltage of the channel layers CH is again increased to 0V from a negative voltage, and hence a phenomenon does not occur, in which the voltages of the word lines are further increased than 0V due to the voltage of the channel layers CH. Accordingly, the reliability of the read operation can be improved.

Figure 9:
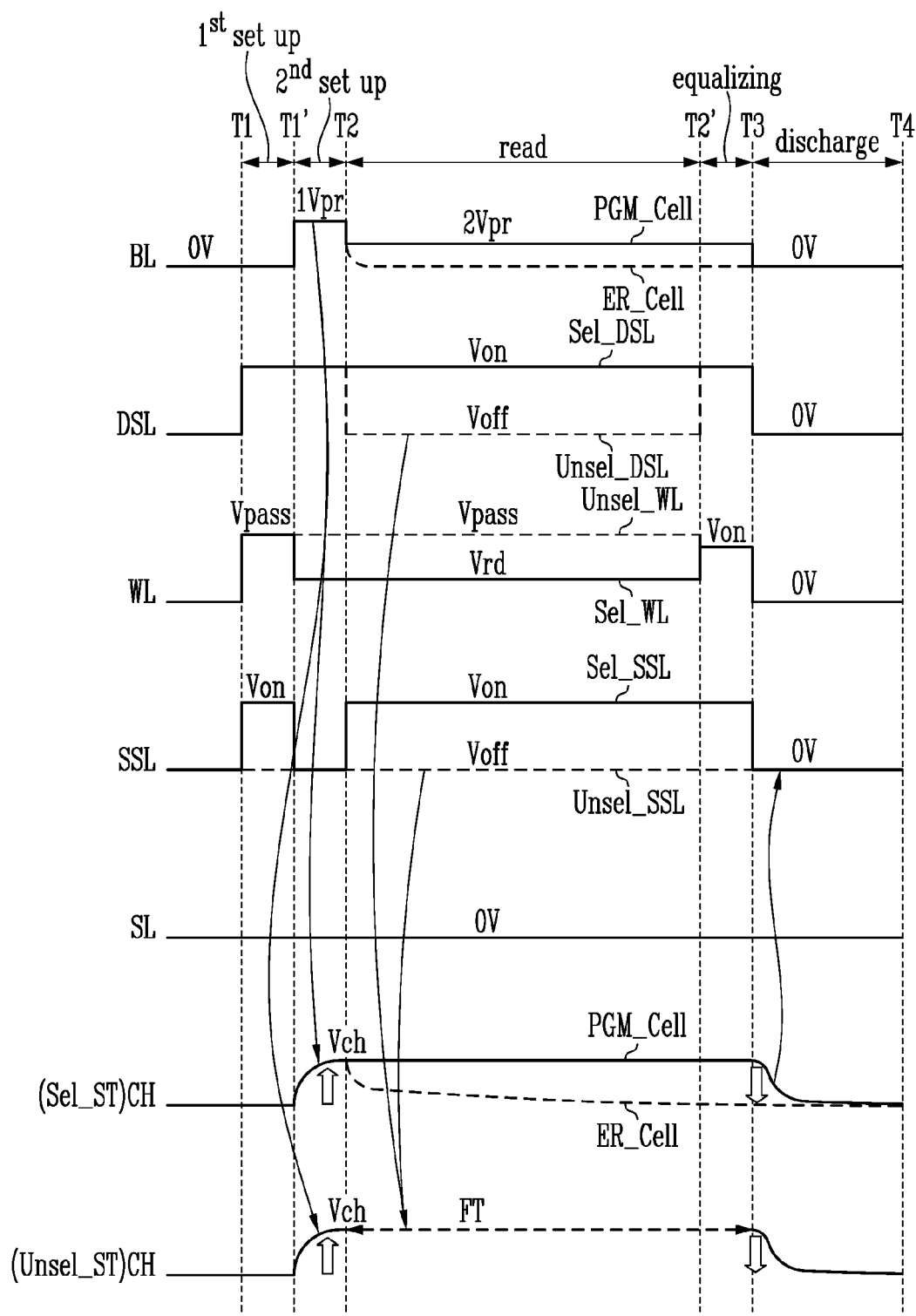
FIG. 9 is a diagram illustrating an operating method of the memory device in accordance with a third embodiment of the present disclosure.

FIG. 9 is a diagram illustrating an operating method of the memory device in accordance with a third embodiment of the present disclosure.

Referring to FIG. 9, a read operation of the memory device may include a first set-up phase, a second set-up phase, a read phase, an equalizing phase, and a discharge phase. In the third embodiment, the first set-up phase T1 to T1' and the second set-up phase T1' to T2, which are used to boost a potential of channel layers CH, may be further performed before the read phase T2 to T2' is performed. Each phase will be described in detail as follows.

The first set-up phase T1 to T1' is a phase for increasing voltages of word lines WL. When the first set-up phase T1 to T1' is started, a turn-on voltage Von may be applied to a selected drain select line Sel_DSL, an unselected drain select line Unsel_DSL, and a selected source select line Sel_SSL, and a pass voltage Vpass may be applied to a selected word line Sel_WL and unselected word lines Unsel_WL. The turn-on voltage Von or a turn-off voltage Voff may be applied to an unselected source select line Unsel_SSL, and an embodiment in which the turn-off voltage Voff is applied is illustrated in FIG. 9. A voltage of 0V may be applied to the bit lines BL and the source line SL. Therefore, in the first set-up phase T1 to T1', the potential of the channel layers CH may become 0V.

When the second set-up phase T1' to T2 is started, the turn-off voltage Voff may be applied to the selected source select line Sel_SSL, and a read voltage Vrd may be applied to the selected word line Sel_WL. A first precharge voltage 1Vpr may be applied to the bit lines BL. The first precharge voltage 1Vpr may be set as a positive voltage higher than a second precharge voltage 2Vpr used in the read phase T2 to T2'. In the second set-up phase T1' to T2, the drain select transistors are turned on by the turn-on voltage Von, and hence the bit lines BL and a channel layer CH may be electrically connected to each other. Therefore, a voltage of the channel layer CH may be increased to a channel voltage Vch as a positive voltage by the first precharge voltage 1Vpr supplied to the bit lines BL. When a high voltage such as the first precharge voltage 1Vpr is applied to the bit lines BL in the second set-up phase T1' to T2, voltage of channel layers CH of selected strings Sel_ST and unselected strings Unsel_ST may be further increased than when the bit lines BL are precharged by the second precharge voltage 2Vpr.

The read phase T2 to T2' is a phase in which a threshold voltage of a selected memory cell is reflected to the bit lines BL. At a second time T2 at which the read phase T2 to T2' is started, the second precharge voltage 2Vpr lower than the first precharge voltage 1Vpr may be applied to the bit lines BL, and the turn-off voltage Voff may be applied to the unselected drain select line Unsel_DSL and the unselected source select line Unsel_SSL. A read voltage Vrd may be applied to the selected word line Sel_WL. When the turn-off voltage Voff is applied to the unselected drain select line Unsel_DSL and the unselected source select line Unsel_SSL, drain select transistors and source select transistors, which are included in the unselected strings Unsel_ST, are turned off, and therefore, the channel layer CH of the unselected strings Unsel_ST may be in a floating state (FT).

The read voltage Vrd is a voltage for determining data of memory cells, and may be set to voltages having various levels according to a threshold voltage distribution of memory cells which become targets of the read operation. While the read voltage Vrd is applied to the selected word line Sel_WL, the pass voltage Vpass is applied.

When the turn-on voltage Von is applied to the selected drain select line Sel_DSL and the selected source select line Sel_SSL, drain and source select transistors included in selected strings are turned on, and therefore, a channel voltage Vch of the selected strings may be maintained or lowered according to a threshold voltage of selected memory cells connected to the selected word line Sel_WL. For example, when the threshold voltage of the selected memory cells is higher than or equal to the read voltage Vrd, the selected memory cells may be determined as program cells PGM_Cell. When the threshold voltage of the selected memory cells is lower than the read voltage Vrd, the selected memory cells may be determined as erase cells ER_Cell. That is, since the threshold voltage of the program cells PGM_Cell is higher than or equal to the read voltage Vrd, the program cells PGM_Cell are turned off, and therefore, the channel voltage Vch of the channel layer CH of the selected strings Sel_ST may be maintained as a voltage precharged in the second set-up phase T1' to T2. Alternatively, since the threshold voltage of the erase cells ER_Cell is lower than the read voltage Vrd, the erase cells ER_Cell are turned on, and therefore, the channel voltage Vch of the channel layer CH of the selected strings Sel_ST may become lower than the voltage precharged in the second set-up phase T1' to T2.

The equalizing phase T2' to T3 is a phase for equally adjusting voltages of word lines WL before the discharge phase T3 to T4, and may be performed to prevent the voltages of the word lines WL from becoming different from each other in the discharge phase T3 to T4 or to prevent voltages of some of the word lines WL from being lowered to a negative voltage. For example, when the equalizing phase T2' to T3 is started, a positive voltage may be applied to the selected word line Sel_WL such that a voltage of the selected word line Sel_WL becomes equal to a voltage applied to the unselected word lines Unsel_WL. The pass voltage Vpass may be applied to the selected word line Sel_WL and the unselected word lines Unsel_WL. The turn-on voltage Von equal to the voltage applied to the selected drain select line Sel_DSL may be applied to the unselected drain select line Unsel_DSL.

The discharge phase T3 to T4 is a phase in which voltages of lines connected to a selected memory block and the channel layer CH are reset. For example, in the discharge phase T3 to T4, all lines connected to the selected memory block may be discharged. The term "discharge" means that lines to which a positive voltage is applied are electrically connected to a ground terminal, thereby lowering a voltage of the lines to 0V. In the discharge phase T3 to T4, voltage of the channel layers CH of the selected strings Sel_ST and the unselected string Unsel_ST may be lowered due to coupling to word lines WL. Since the voltage of the channel layers CH is precharged to a high level by the first precharge voltage 1Vpr in the second set-up phase T1' to T2, the voltage of the channel layers CH is not lowered to a level lower than 0V in the discharge phase T3 to T4.

In the discharge phase T3 to T4, there is no period in which the voltage of the channel layers CH is again increased to 0V from a negative voltage, and hence a phenomenon does not occur, in which the voltages of the word lines are further increased than 0V due to the voltage of the channel layers CH. Accordingly, the reliability of the read operation can be improved.

Figure 10:
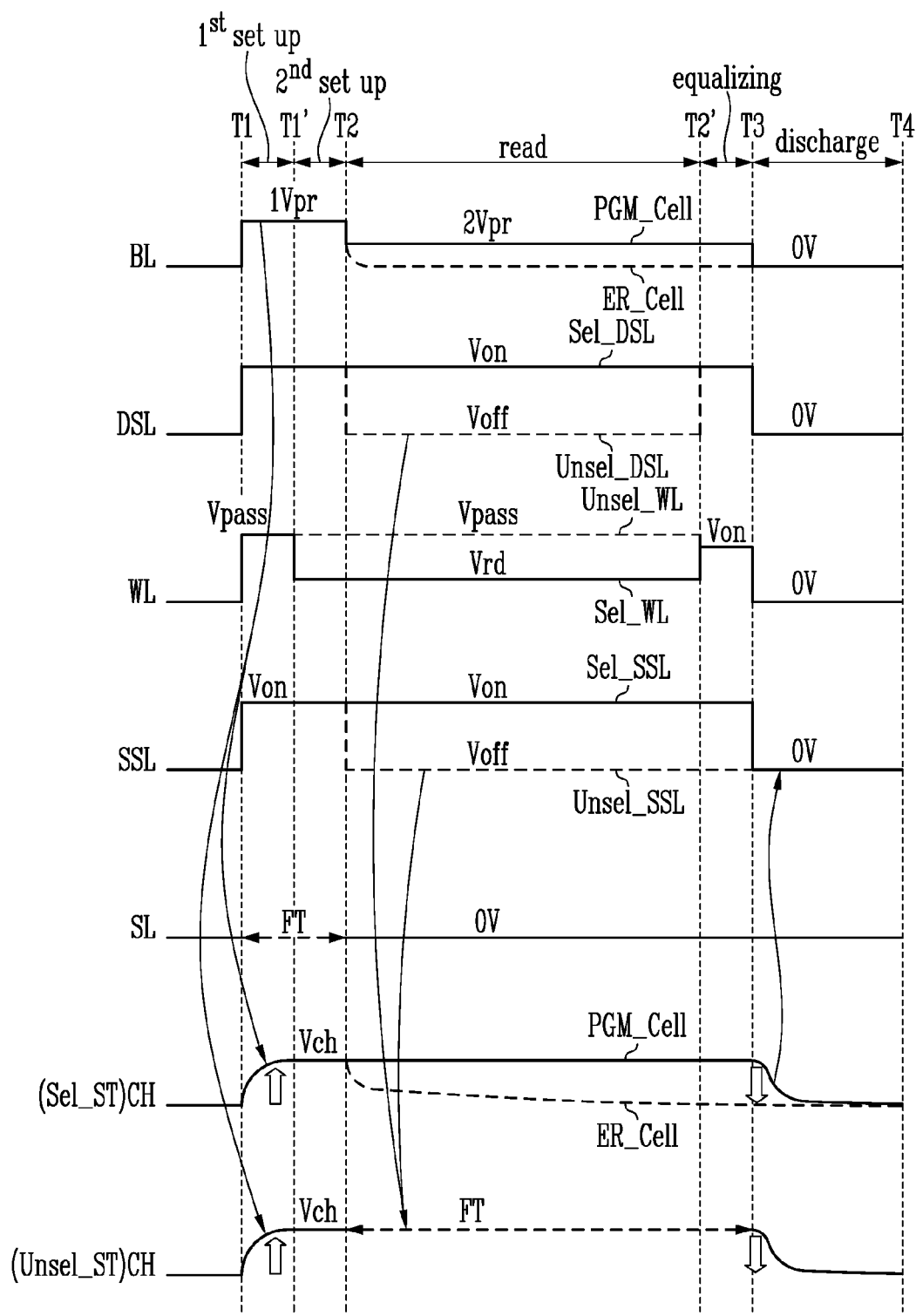
FIG. 10 is a diagram illustrating an operating method of the memory device in accordance with a fourth embodiment of the present disclosure.

FIG. 10 is a diagram illustrating an operating method of the memory device in accordance with a fourth embodiment of the present disclosure.

Referring to FIG. 10, a read operation of the memory device may include a first set-up phase, a second set-up phase, a read phase, an equalizing phase, and a discharge phase. In the fourth embodiment, a first precharge voltage 1Vpr may be supplied to the bit lines BL in the first set-up phase T1 to T1'. Each phase will be described in detail as follows.

The first set-up phase T1 to T1' is a phase for increasing voltages of word lines WL and a voltage of channel layers CH. When the first set-up phase T1 to T1' is started, the first precharge voltage 1Vpr may be applied to bit lines BL, a turn-on voltage Von may be applied to a selected drain select line Sel_DSL, an unselected drain select line Unsel_DSL, a selected source select line Sel_SSL, and an unselected source select line Unsel_SSL, and a pass voltage Vpass may be applied to a selected word line Sel_WL and unselected word lines Unsel_WL. The first precharge voltage 1Vpr may be set as a positive voltage higher than a second precharge voltage 2Vpr used in the read phase T2-T2'. Since the source select transistors are turned on, the source line SL may be floated (FT) so as to prevent a potential of the channel layers CH from being lowered. Therefore, in the first set-up phase T1-T1', a potential of channel layers CH of selected strings Sel_ST and unselected strings Unsel_ST may be increased up to a channel voltage Vch as a positive voltage. When a high voltage such as the first precharge voltage 1Vpr is applied to the bit lines BL in the first set-up phase T1 to T1', a voltage of the channel layers CH of the selected strings Sel_ST and the unselected strings Unsel_ST may be further increased than when the bit lines BL are precharged by the second precharge voltage 2Vpr.

When the second set-up phase T1' to T2 is started, a read voltage Vrd may be applied to the selected word line Sel_WL. The source line SL may be maintained in a floating state (FT) such that a channel voltage of the channel layer CH is not lowered.

The read phase T2 to T2' is a phase in which a threshold voltage of a selected memory cell is reflected to the bit lines BL. At a second time T2 at which the read phase T2 to T2' is started, the second precharge voltage 2Vpr lower than the first precharge voltage 1Vpr may be applied to the bit lines BL, and the turn-off voltage Voff may be applied to the unselected drain select line Unsel_DSL and the unselected source select line Unsel_SSL. Therefore, a voltage of 0V may be applied to the source line SL from the second time T2. A read voltage Vrd may be applied to the selected word line Sel_WL. When the turn-off voltage Voff is applied to the unselected drain select line Unsel_DSL and the unselected source select line Unsel_SSL, drain select transistors and source select transistors, which are included in the unselected strings Unsel_ST, are turned off, and therefore, the channel layer CH of the unselected strings Unsel_ST may be in a floating state (FT).

The read voltage Vrd is a voltage for determining data of memory cells, and may be set to voltages having various levels according to a threshold voltage distribution of memory cells which become targets of the read operation. While the read voltage Vrd is applied to the selected word line Sel_WL, the pass voltage Vpass is applied.

When the turn-on voltage Von is applied to the selected drain select line Sel_DSL and the selected source select line Sel_SSL, drain and source select transistors included in selected strings are turned on, and therefore, a channel voltage Vch of the selected strings may be maintained or lowered according to a threshold voltage of selected memory cells connected to the selected word line Sel_WL. For example, when the threshold voltage of the selected memory cells is higher than or equal to the read voltage Vrd, the selected memory cells may be determined as program cells PGM_Cell. When the threshold voltage of the selected memory cells is lower than the read voltage Vrd, the selected memory cells may be determined as erase cells ER_Cell. That is, since the threshold voltage of the program cells PGM_Cell is higher than or equal to the read voltage Vrd, the program cells PGM_Cell are turned off, and therefore, the channel voltage Vch of the channel layer CH of the selected strings Sel_ST may be maintained as a voltage precharged in the second set-up phase T1' to T2. Alternatively, since the threshold voltage of the erase cells ER_Cell is lower than the read voltage Vrd, the erase cells ER_Cell are turned on, and therefore, the channel voltage Vch of the channel layer CH of the selected strings Sel_ST may become lower than the voltage precharged in the second set-up phase T1' to T2.

The equalizing phase T2' to T3 is a phase for equally adjusting voltages of word lines WL before the discharge phase T3 to T4, and may be performed to prevent the voltages of the word lines WL from becoming different from each other in the discharge phase T3 to T4 or to prevent voltages of some of the word lines WL from being lowered to a negative voltage. For example, when the equalizing phase T2' to T3 is started, a positive voltage may be applied to the selected word line Sel_WL such that a voltage of the selected word line Sel_WL becomes equal to a voltage applied to the unselected word lines Unsel_WL. The pass voltage Vpass may be applied to the selected word line Sel_WL and the unselected word lines Unsel_WL. The turn-on voltage Von equal to the voltage applied to the selected drain select line Sel_DSL may be applied to the unselected drain select line Unsel_DSL.

The discharge phase T3 to T4 is a phase in which voltages of lines connected to a selected memory block and the channel layer CH are reset. For example, in the discharge phase T3 to T4, all lines connected to the selected memory block may be discharged. The term "discharge" means that lines to which a positive voltage is applied are electrically connected to a ground terminal, thereby lowering a voltage of the lines to 0V. In the discharge phase T3 to T4, a voltage of the channel layers CH of the selected strings Sel_ST and the unselected string Unsel_ST may be lowered due to coupling to word lines WL. Since the voltage of the channel layers CH is precharged to a high level by the first precharge voltage 1Vpr in the second set-up phase T1' to T2, the voltage of the channel layers CH is not lowered to a level lower than 0V in the discharge phase T3 to T4.

In the discharge phase T3 to T4, there is no period in which the voltage of the channel layers CH is again increased to 0V from a negative voltage, and hence a phenomenon does not occur, in which the voltages of the word lines are further increased than 0V due to the voltage of the channel layers CH. Accordingly, the reliability of the read operation can be improved.

Figure 11:
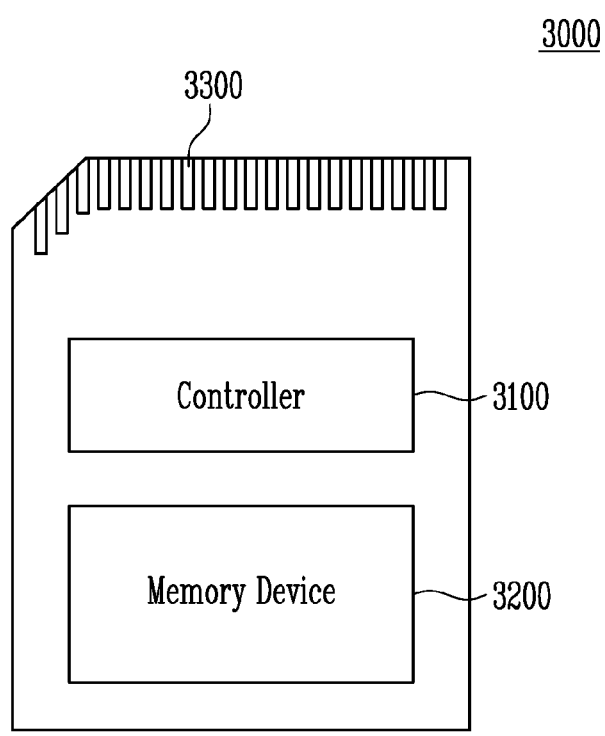
FIG. 11 is a diagram illustrating a memory card system to which a memory device in accordance with an embodiment of the present disclosure is applied.

FIG. 11 is a diagram illustrating a memory card system 3000 to which a memory device in accordance with an embodiment of the present disclosure is applied.

Referring to FIG. 11, the memory card system 3000 includes a controller 3100, a memory device 3200, and a connector 3300.

The controller 3100 may be connected to the memory device 3200. The controller 3100 may access the memory device 3200. For example, the controller 3100 may control a program, read or ease operation, or control a background operation of the memory device 3200. The controller 3100 may provide an interface between the memory device 3200 and a host. The controller 3100 may drive firmware for controlling the memory device 3200. For example, the controller 3100 may include components such as Random Access Memory (RAM), a processing unit, a host interface, a memory interface, and the error corrector.

The controller 3100 may communicate with an external device through the connector 3300. The controller 3100 may communicate with the external device (e.g., the host) according to a specific communication protocol. Exemplarily, the controller 3100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. Exemplarily, the connector 3300 may be defined by at least one of the above-described various communication protocols.

The memory device 3200 may include memory cells, and be configured identically to the memory device 100 shown in FIG. 1.

The controller 3100 and the memory device 3200 may be integrated into a single semiconductor device, to constitute a memory card. For example, the controller 3100 and the memory device 3200 may constitute a memory card such as a personal computer (PC) memory card, a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 12:
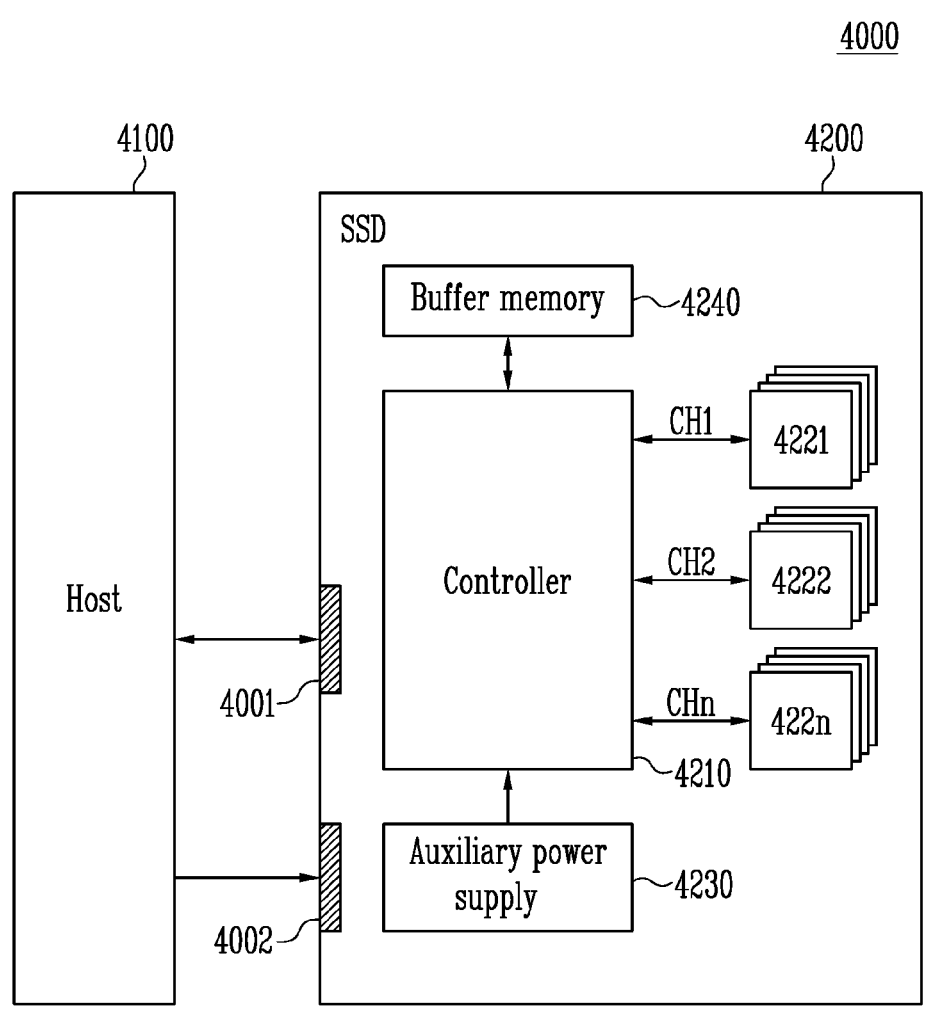
FIG. 12 is a diagram illustrating a Solid State Drive (SSD) system to which a memory device in accordance with an embodiment of the present disclosure is applied.

FIG. 12 is a diagram illustrating a Solid State Drive (SSD) system 4000 to which a memory device in accordance with an embodiment of the present disclosure is applied.

Referring to FIG. 12, the SSD system 4000 includes a host 4100 and an SSD 4200. The SSD 4200 exchanges a signal SIG with the host 4100 through a signal connector 4001, and receives power PWR through a power connector 4002. The SSD 4200 includes a controller 4210, a plurality of memory devices 4221 to 422n, an auxiliary power supply 4230, and a buffer memory 4240.

The controller 4210 may control the plurality of memory devices 4221 to 422n in response to a signal received from the host 4100. The signal may be a signal based on an interface between the host 4100 and the SSD 4200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The plurality of memory devices 4221 to 422n may include cells capable of storing data. Each of the plurality of memory devices 4221 to 422n may be configured identically to the memory device 100 shown in FIG. 1.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power of the SSD 4200. Exemplarily, the auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may operate as a buffer memory of the SSD 4200. For example, the buffer memory 4240 may temporarily store data received from the host 4100 or data received from the plurality of memory devices 4221 to 422n, or temporarily store meta data (e.g., a mapping table) of the memory devices 4221 to 422n. The buffer memory 4240 may include volatile memory such as DRAM, SDRAM, DDR SDRAM, LPDDR SDRAM, and GRAM or may include nonvolatile memory such as FRAM, ReRAM, STT-MRAM, and PRAM.

In accordance with some embodiments of the present disclosure, the reliability of a read operation performed in a memory device may be improved.

While the present disclosure has been shown and described with reference to certain embodiments thereof, it will be understood by those skilled in the art that various changes in form and detail may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or some of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure.

Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
a memory block including strings formed between bit lines and a source line; and
a peripheral circuit configured to perform a read operation of a selected memory cell included in a selected string among the strings,
wherein the peripheral circuit includes page buffers configured to:
increase a voltage of channels of the strings by applying a first precharge voltage to the bit lines in a set-up phase of the read operation;
apply a second precharge voltage lower than the first precharge voltage to the bit lines in a read phase of the read operation; and
discharge the bit lines in a discharge phase of the read operation,
wherein, in the set-up phase, the peripheral circuit is configured to apply a pass voltage to both selected word lines and unselected word lines connected to the strings, and
wherein, in the read phase, the peripheral circuit is configured to float a channel of an unselected string of the strings.

2. The memory device of claim 1, wherein, in the set-up phase, the peripheral circuit is configured to apply a voltage of 0V to the source line.

3. The memory device of claim 2, wherein, in the set-up phase, the peripheral circuit is configured to turn on drain select transistors which are connected between the bit lines and memory cells in the strings.

4. The memory device of claim 2, wherein, in the set-up phase, the peripheral circuit is configured to turn off source select transistors which are connected between the source line and memory cells in the strings.

5. The memory device of claim 1, wherein, to float the channel of the unselected string, the peripheral circuit is configured to turn off an unselected drain select transistor and an unselected source select transistor, which are included in the unselected string.

6. The memory device of claim 1, wherein, in the read phase, the peripheral circuit is configured to apply a read voltage to a selected word line connected to the selected memory cell included in the selected string.

7. The memory device of claim 1, wherein, in the set-up phase, the peripheral circuit is configured to float the source line.

8. The memory device of claim 7, wherein, in the set-up phase, the peripheral circuit is configured to turn on drain select transistors which are connected between the bit lines and memory cells in the strings and turn on source select transistors which are connected between the source line and memory cells in the strings.

9. The memory device of claim 8, wherein, in the set-up phase, the peripheral circuit is configured to apply a read voltage to a selected word line among the word lines, when the pass voltage is applied to the word lines.

10. The memory device of claim 1, wherein, before the discharge phase is performed, the peripheral circuit is configured to perform an equalizing phase for equally adjusting voltages of word lines connected to the strings.

11. The memory device of claim 1, wherein, in the discharge phase, the peripheral circuit is configured to discharge a source select line, word lines, and a drain select line, which are connected to the strings.

12. A method of operating a memory device, the method comprising:
increasing a channel voltage by applying a first precharge voltage to bit lines electrically coupled to channels of strings;
applying a second precharge voltage lower than the first precharge voltage to the bit lines, when the channel voltage is increased;
applying a read voltage to a selected word line among word lines arranged between the bit lines and a source line; and
discharging the bit lines and the word lines,
wherein, in increasing the channel voltage, applying a pass voltage to both selected word lines and unselected word lines which connected to the strings, and
wherein, in applying the second precharge voltage to the bit lines, unselected drain select transistors and unselected source select transistors, which are connected to the unselected string, are turned off.

13. The method of claim 12, wherein, in increasing the channel voltage, a drain select transistor is turned on by applying a turn-on voltage to a drain select line adjacent to the bit lines, and a source select transistor is turned off by applying a turn-off voltage to a source select line adjacent to the source line, when a voltage of 0V is applied to the source line.

14. The method of claim 12, wherein, in increasing the channel voltage, a drain select transistor is turned on by applying a turn-on voltage to a drain select line adjacent to the bit lines, and a source select transistor is turned on by applying a turn-on voltage to a source select line adjacent to the source line, when the source line is floated.

15. The method of claim 12, wherein, when the read voltage is applied to the selected word line, a pass voltage is applied to unselected word lines.

16. The method of claim 12, wherein an equalizing phase for equally adjusting voltages of the word lines is further included between the applying of the read voltage and the discharging.

* * * * *